United States Patent [19]
Ikeguchi et al.

[11] 4,149,125
[45] Apr. 10, 1979

[54] FREQUENCY SYNTHESIZER FOR TRANSMITTER RECEIVER USING A PHASE LOCKED LOOP

[75] Inventors: Shigehiko Ikeguchi, Gunma; Noboru Usui, Oota; Norio Yamashita, Gunma, all of Japan

[73] Assignees: Sanyo Electric Co., Ltd., Moriguchi; Tokyo Sanyo Electric Co., Ltd, Gunma, both of Japan

[21] Appl. No.: 746,707

[22] Filed: Dec. 2, 1976

[30] Foreign Application Priority Data

Dec. 16, 1975 [JP] Japan .................................. 50-150407

[51] Int. Cl.² .............................................. H03B 3/04
[52] U.S. Cl. ..................................... 331/1 A; 325/20; 325/25; 331/25
[58] Field of Search ........................... 331/1 A, 18, 25; 325/20, 21, 25, 17

[56] References Cited

U.S. PATENT DOCUMENTS

| | | | |
|---|---|---|---|
| 3,854,102 | 12/1974 | Seipel et al. | 331/1 A |
| 3,944,925 | 3/1976 | DeLaune | 331/1 A X |
| 3,983,484 | 9/1976 | Hodama | 325/20 |
| 4,002,995 | 1/1977 | Reed | 331/1 A |

*Primary Examiner*—Siegfried H. Grimm
*Attorney, Agent, or Firm*—Darby & Darby

[57] ABSTRACT

A frequency synthesizer for use in a transmitter/receiver, comprising a voltage controlled oscillator, a programmable frequency divider for dividing the frequency of the output from the voltage controlled oscillator, a reference oscillator, a reference counter for dividing the frequency of the output from the reference oscillator, a phase detector for phase detecting the frequencies of the reference counter and the frequency divider for providing a control voltage to said voltage controlled oscillator, a transmitting/receiving mode selection circuit for selectively controlling the programmable frequency divider such that the frequency division rate thereof is different in the transmitting and receiving modes, a channel designating circuit, a first output terminal for withdrawing an output by mixing the output from the voltage controlled oscillator with the output from the reference oscillator, and a second output terminal for directly withdrawing the output from the voltage controlled oscillator, said transmitting/receiving mode selection circuit comprising a transmitter/receiver selection switch, and full adder means or a read only memory for storing in advance information concerning the frequency division rate of the frequency divider based on the output from the transmitter/receiver selection switch and the output from the channel designating circuit.

9 Claims, 14 Drawing Figures

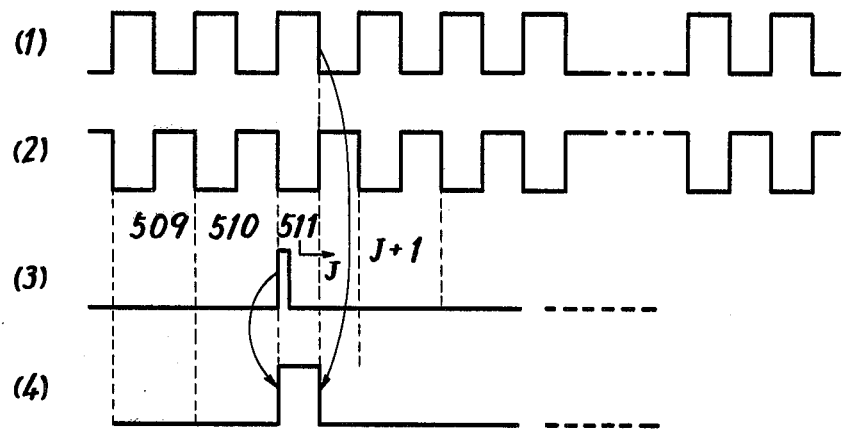
FIG. 2B
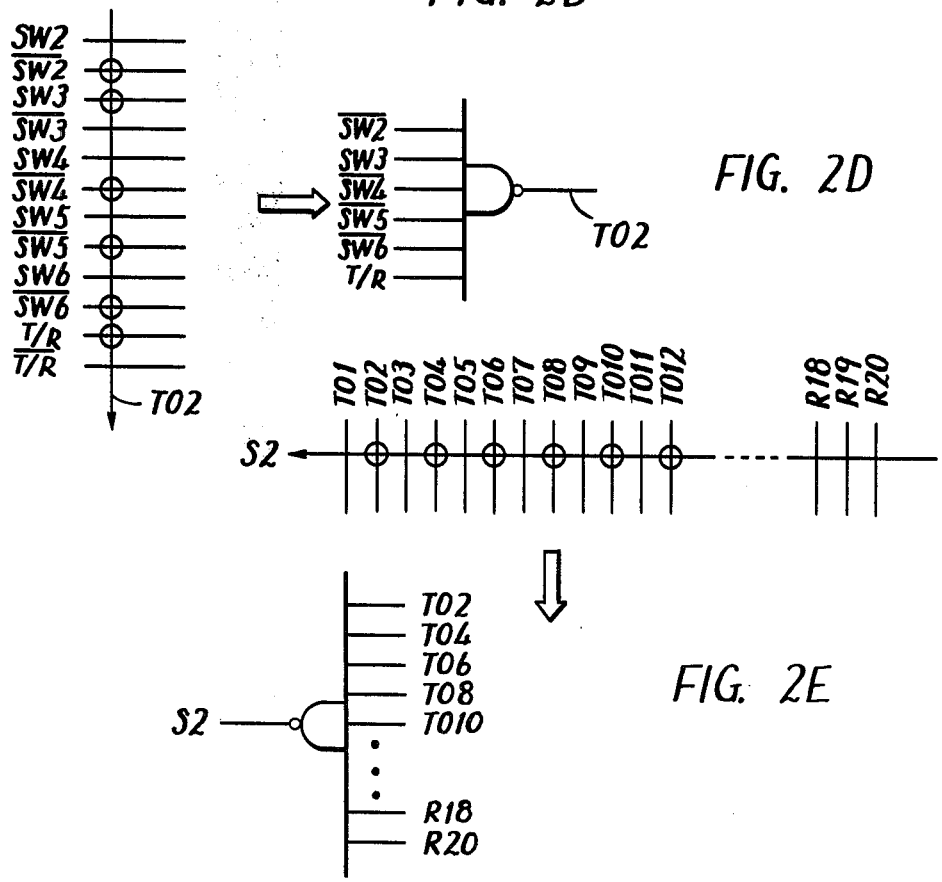
FIG. 2D
FIG. 2E

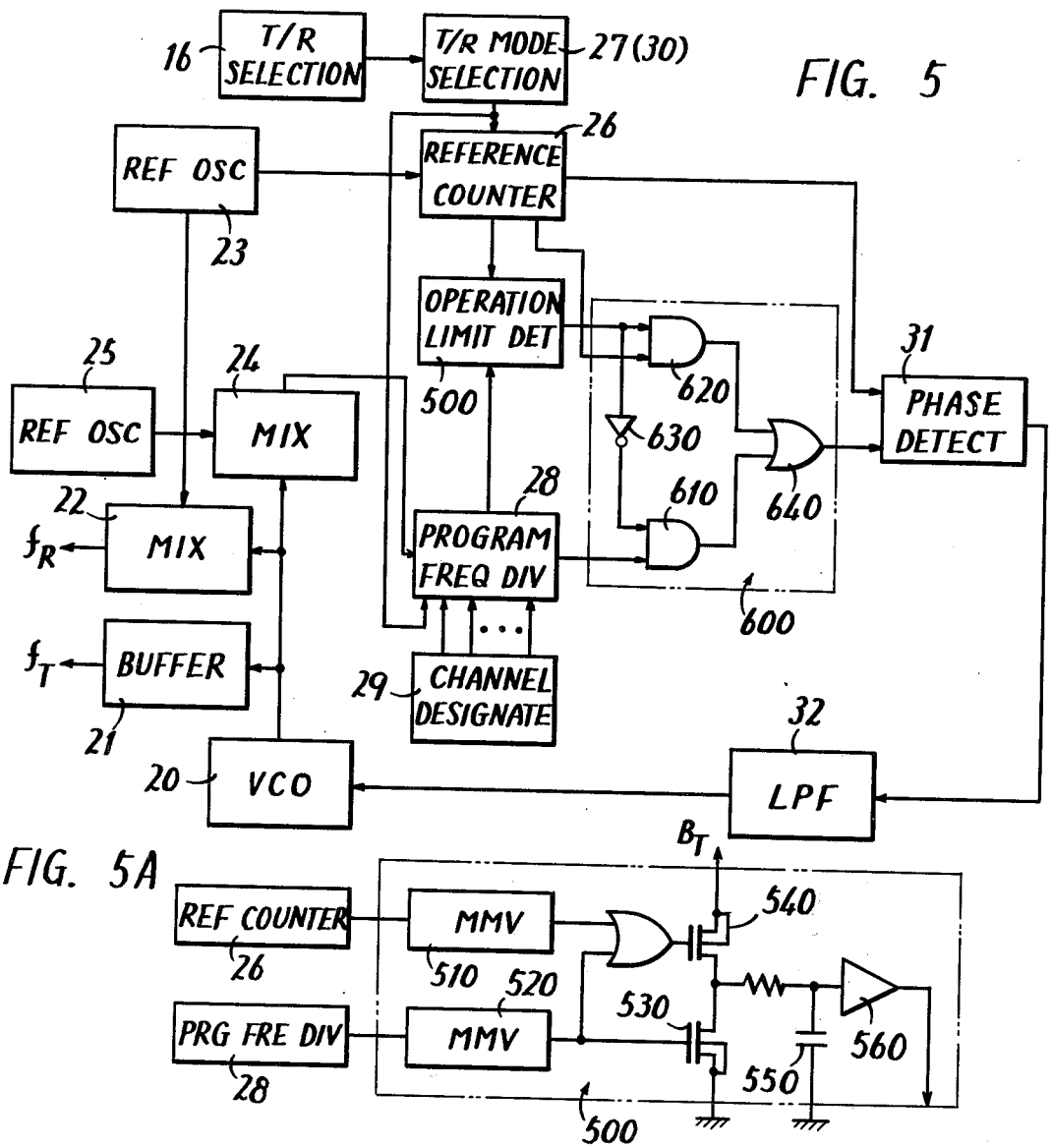
FIG. 5
FIG. 5A
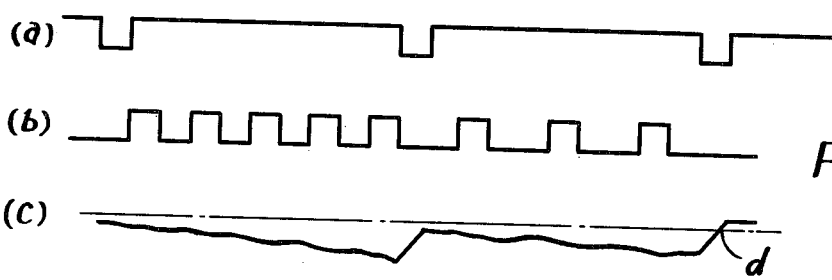
FIG. 5B

FREQUENCY SYNTHESIZER FOR TRANSMITTER RECEIVER USING A PHASE LOCKED LOOP

BACKGROUND OF THE INVENTION

1. Field of the Invention

The present invention relates to a frequency synthesizer for use in a transmitter/receiver. More specifically, the present invention relates to a frequency synthesizer for use in a transmitter/receiver adapted to be capable of providing an oscillation frequency signal of various desired frequencies.

2. Description of the Prior Art

A digital frequency synthesizer has been proposed and in practical use. Such a frequency synthesizer is much more advantageous in that it can provide a much more stabilized oscillation frequency. A typical frequency synthesizer employs a phase locked loop, which is often simply referred to as "PLL."

A frequency synthesizer employing a phase locked loop usually comprises a voltage controlled oscillator the oscillation frequency of which is controllable as a function of an output voltage, as low pass filtered, obtainable from a phase detector, which is adapted to compare the phase or the frequency of the output from a reference oscillator and the phase or the frequency of an output from a programmable frequency divider adapted to frequency divide the output frequency from the said voltage controlled oscillator at the frequency division rate which is adapted to be variable as a function of a control signal. Automatic scanning of the oscillation frequency of the output from the said voltage controlled oscillator is effected by varying the said control signal and thus the frequency division rate of the programmable frequency divider.

Such a frequency synthesizer has been utilized by way of a frequency signal generator in a citizens band transceiver, for example. However, since in a citizens band transceiver the frequency of the received signal in the receiving mode is in any one frequency band within the frequency range of 29.965 MHz through 27.255 MHz depending on the channel of the received signal, the oscillation frequency of the frequency signal generator should also be changed within the frequency range of 37.66 MHz through 37.92 MHz depending on the receiving channel in order to obtain a constant intermediate frequency of 10.695 MHz. On the other hand, in the transmitting mode, the oscillation frequency of the frequency signal generator should be changed within the frequency range of 26.965 MHz through 27.255 MHz depending on the channel in which a modulated carrier wave is to be transmitted. A typical approach for changing the frequency variable range depending on the transmitting and receiving modes in such a frequency signal generator employing a frequency synthesizer comprises two reference oscillators, which are typically crystal oscillators. One of them is a reference oscillator to be included basically in a frequency synthesizer for providing a reference signal of the frequency of 26.965 MHz to be phase detected and the other oscillator is a reference oscillator to be used only on the occasion of reception for providing a reference frequency of 10.695 MHz to be mixed with the output from a voltage controlled oscillator to be used by way of a local oscillator.

As described previously, a typical prior art frequency synthesizer to be used in a transceiver comprises at least two crystal oscillators. Since provision of one such crystal oscillator entails an increase of cost of approximately ten percent of the whole apparatus, reduction of cost in this connection is of great interest. If any scheme can be implemented which is capable of skillfully selecting the transmitting and receiving modes with a less number of crystal oscillators, then it would be much advantageous from the stand point of cost, even if a configuration of the circuit concerned becomes complicated, insofar as the circuit is implemented by an integrated circuit.

SUMMARY OF THE INVENTION

Briefly stated, the present invention comprises a frequency synthesizer for generating an oscillation frequency signal, said signal being in at least one of first and second variable frequency ranges; said frequency synthesizer comprising voltage controlled oscillating means for providing an oscillation frequency signal the oscillation frequency of which is variable as a function of a given control voltage, means for modifying the oscillation frequency of the output from said voltage controlled oscillating means, means for controlling the rate of frequency modification of said oscillation frequency modifying means, means responsive to the output from said oscillation frequency modifying means, as modified at the frequency modification rate controlled by said frequency rate controlling means, for providing a control voltage associated with the frequency of the output from said oscillation frequency modifying means to said voltage controlled oscillating means, whereby said frequency synthesizer is adapted to provide an oscillation frequency signal the frequency of which is associated with the frequency modification rate, as controlled by said frequency modification rate controlling means, means for selecting a first operation mode for providing an oscillation signal of the frequency within said first variable frequency range and a second operation mode for providing an oscillation signal of the frequency within said second variable frequency range, means responsive to the output from said mode selecting means for accommodating the control of the frequency modification rate by said frequency modification rate controlling means for enabling generation of the frequencies in the corresponding mode, and first and second output withdrawing means for withdrawing the oscillation frequency signal in the corresponding operation mode from said controlled oscillating means in response to the output from said mode selecting means.

In the preferred embodiment of the present invention, the said mode selecting means comprises means for designating either of said first and second variable frequency ranges, and means for designating a desired channel within said designated first or second variable frequency range, and said accommodating means comprises means for storing information concerning the frequency division rate of said frequency division rate controlling means, and means responsive to the output from said variable frequency range designating means and the output from said channel designating means for withdrawing information concerning the frequency division rate of the corresponding channel in the corresponding frequency range from said storing means for providing the same to said frequency dividing means.

In a further preferred embodiment of the present invention, the said frequency synthesizer further comprises first detecting means having a detection point in the vicinity of the operation limit of said oscillation frequency modifying means and for detecting the oscillation frequency of said voltage controlled oscillating means having reached said detection point, and means responsive to the detected output from said first detecting means for correcting the control voltage obtainable from said control voltage providing means such that the oscillation frequency of the signal from said voltage controlled oscillating means may be a frequency within a stabilized operation region of said oscillation frequency modifying means.

Therefore, a principal object of the present invention is to provide a frequency synthesizer which is capable of providing an oscillation signal of various desired frequencies.

Another object of the present invention is to provide a frequency synthesizer for use in a transmitter/receiver wherein a voltage controlled oscillator the oscillation frequency of which is controllable as a function of a control signal can be utilized in both the transmitting and receiving modes, whereby a minimum number of voltage controlled oscillators and crystal oscillators can be utilized.

A further object of the present invention is to provide a frequency synthesizer wherein if and when the frequency of the signal from a programmable counter reaches an allowable maximum limit value or exceeds the same to cause a malfunction a signal of a frequency higher than that of the output from the said programmable counter is applied in place of the output from the programmable counter, whereby a control signal for lowering the oscillation frequency of the output from a voltage controlled oscillator is obtained, thereby to bring the operation of the voltage controlled oscillator forcibly to a stabilized operation region of the programmable counter, in order to prevent a malfunction.

These objects and other objects, features, aspects and advantages of the present invention will be better understood from the following detailed description of the preferred embodiment of the present invention when taken in conjunction with the accompanying drawings.

BRIEF DESCRIPTION OF THE DRAWINGS

FIG. 2B shows waveforms of the programmable counter 28 of the FIG. 2A embodiment for use in explaining the operation thereof;

FIG. 2D shows connection between the column and row lines at the intersections therebetween in the matrix MAX1 in the FIG. 2C embodiment;

FIG. 2E shows connection of the final outputs from the read only memory shown in FIG. 2C;

FIG. 5 is a block diagram of still a further embodiment of the inventive frequency synthesizer;

FIG. 5A shows in more detail a schematic diagram of the operation limit detector 500 and associated blocks in the FIG. 5 embodiment; and FIG. 5B shows waveforms at various portions in the FIG. 5A embodiment.

DESCRIPTION OF THE PREFERRED EMBODIMENTS

Figure 1:
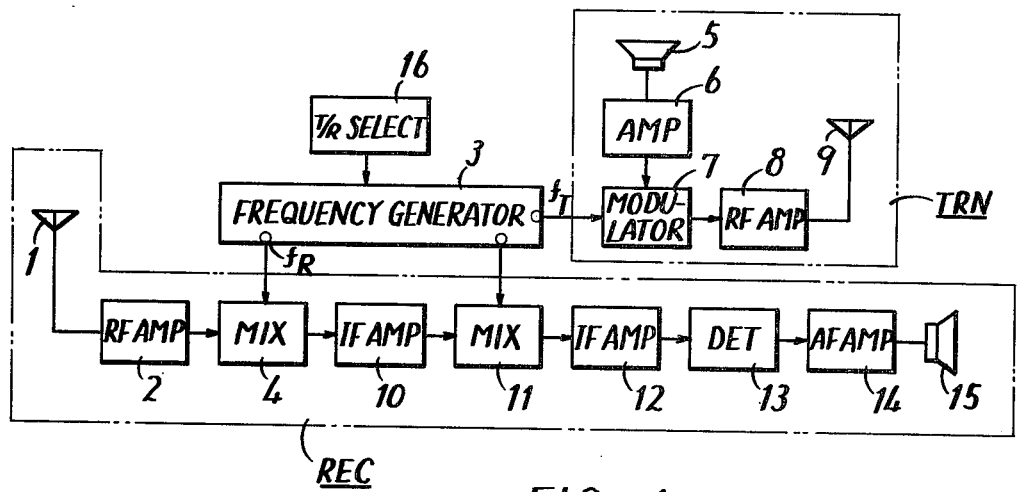
FIG. 1 shows a block diagram of a typical prior art transceiver in which a frequency synthesizer of the present invention can be advantageously employed.

FIG. 1 shows a block diagram of a typical prior art transceiver in which a frequency synthesizer of the present invention can be advantageously employed. The transceiver shown comprises a receiver portion REC for receiving a transmitted wave signal to convert the same into an audible sound, and a transmitter portion TRN for converting an audible sound into a transmitting wave to transmit the same. Such transceiver may comprise a frequency signal generator 3 for providing a local oscillation frequency output and a carrier frequency output to the receiver portion REC and the transmitter portion TRN, respectively, and a transmitter/receiver selection switch 16, such as a press talk switch, for selectively switching a transmitting mode or a receiving mode of the frequency signal generator 3.

The receiver portion REC comprises an antenna 1 for receiving a transmitted wave, a high frequency amplifier 2 for amplifying the received wave signal, a first mixer 4 for mixing the high frequency output from the amplifier 2 with a first local oscillation frequency output from the frequency signal generator 3 to be described subsequently for providing an intermediate frequency output, a first intermediate frequency amplifier 10 for amplifying the intermediate frequency output from the mixer 4, a second mixer 11 for mixing the intermediate frequency output from the first intermediate frequency amplifier 10 with a second local oscillation frequency output from the frequency signal generator 3, a second intermediate frequency amplifier 12 for amplifying the second intermediate output from the mixer 11, a detector 13 for detecting the intermediate frequency output from the second amplifier 12 for providing an audio frequency output, an audio frequency amplifier 14 for amplifying the audio frequency output from the detector 13, and a loud speaker 15 for transducing the audio frequency output from the amplifier 14 into a second output.

The transmitter portion TRN comprises a microphone 5 for converting a sound into an audio electrical signal, an audio amplifier 6 for amplifying the audio electrical signal from the microphone 5, a modulator 7 for modulating a carrier signal of the carrier frequency output from the frequency signal generator 3 with the amplified audio signal for providing a modulated signal, a high frequency amplifier 8 for amplifying the modulated signal from the modulator 7, and a transmitting antenna 9 for transmitting the high frequency output of the modulated signal from the amplifier 8.

The present invention is directed to an improvement in the frequency signal generator 3 for use in such a transceiver comprising a receiver portion REC and a transmitter portion TRN as described above. Such a frequency signal generator 3 is adapted to provide different frequency outputs selectively to the mixers 4 and 11 of the receiver portion REC and the modulator 7 of the transmitter portion TRN, respectively on the occasion of the receiving mode and the transmitting mode, respectively. In case of the receiving mode, for example, the frequency of the carrier wave signal as received by the antenna 1 ranges from 26.965 MHz to 27.255 MHz, for example, such that each channel dominates a corresponding frequency band. Therefore, in order to obtain a constant intermediate frequency of 10.695 MNz, the frequency signal generator 3 should be adapted such that the frequency signal output from the generator 3 is adaptably changed ranging from 37.66 MHz to 37.92 MHz in association with the receiving channels. On the other hand, in case of the transmitting mode, in order to change the frequency of the carrier wave ranging from 26.965 MHz in association with the transmitting channels, the frequency signal generator 3 should be adapted such that the frequency of the frequency signals from the generator 3 is adaptably changed accordingly within the above described frequency range. In other words, the frequency signal generator 3 should provide an output of a variable frequency in association with the transmitting channels and the receiving channels. To that end, the frequency signal generator 3 is provided with the transmitter/receiver selection switch 16 for selectively switching the transmitting mode or the receiving mode. The present invention employs a frequency synthesizer capable of providing an oscillation frequency variable within the above described frequency range that serves as the above described frequency signal generator 3.

Figure 2:
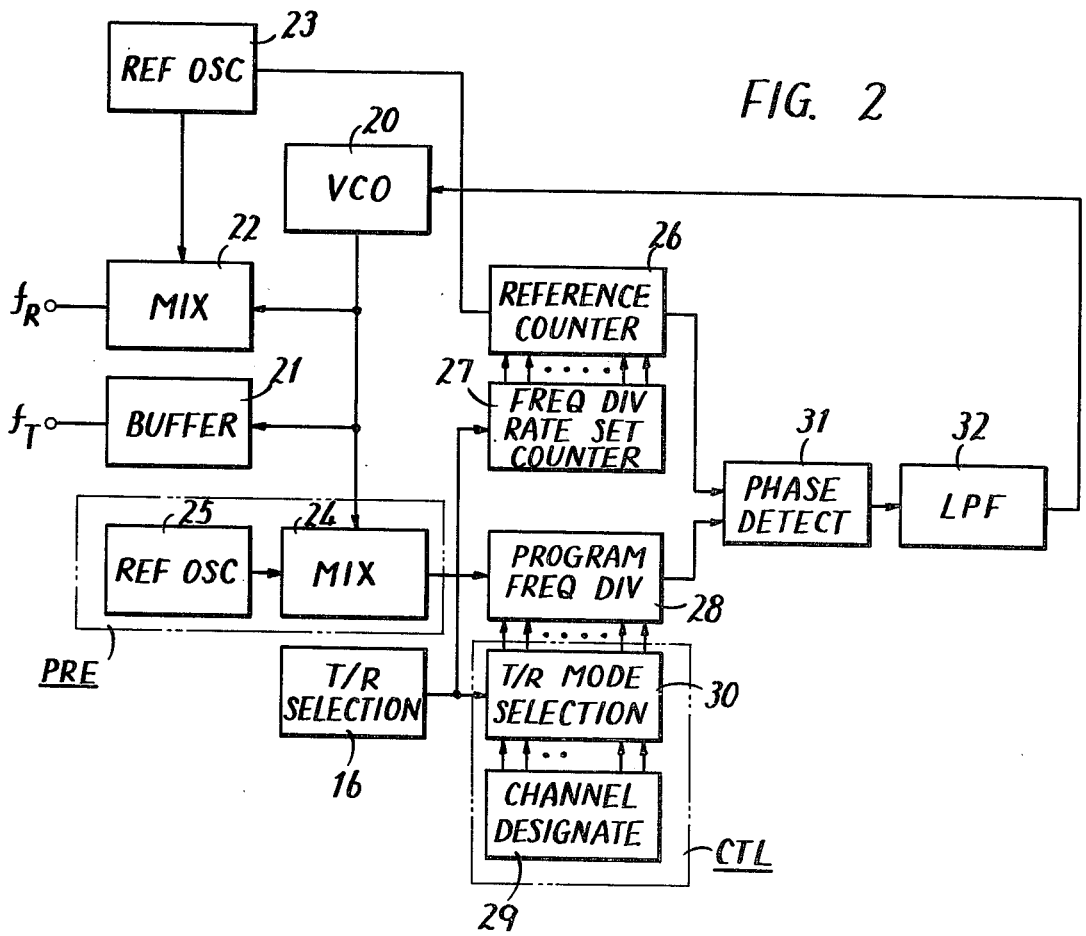
FIG. 2 shows a block diagram of one embodiment of the inventive frequency synthesizer that can be advantageously utilized as the frequency signal generator 3 of the FIG. 1 transceiver.

FIG. 2 shows a block diagram of one embodiment of the inventive frequency synthesizer that can be advantageously utilized as the frequency signal generator 3 of the FIG. 1 transceiver. The inventive frequency synthesizer basically comprises a voltage controlled oscillator 20. The voltage controlled oscillator 20 is structured such that the oscillation frequency thereof is varied as a function of a control voltage applied thereto. The oscillation output from the voltage controlled oscillator 20 is withdrawn through a buffer 21 from an output terminal $f_T$. The oscillation output from the voltage controlled oscillator 20 is also applied to a first mixer 22, where the oscillation output is mixed with the reference frequency output from a reference signal oscillator 23 which is preferably a crystal oscillator. The frequency converted output thus obtained is withdrawn from an output terminal $f_R$. Thus, it is appreciated that the frequency synthesizer shown comprises two output terminals, i.e. the output terminal $f_T$ for a transmitting mode and the output terminal $f_R$ for a receiving mode. The output obtained from the transmitting mode terminal $f_T$ is applied to the modulator 7 in the FIG. 1 transceiver to be used by way of a carrier wave signal, whereas the output obtained from the receiving mode terminal $f_R$ is applied to the mixer 4 in the FIG. 1 transceiver to be used by way of a local oscillation frequency signal. In the frequency synthesizer shown, a control voltage to be applied to the voltage controlled oscillator 20 is provided as an output from a phase detector 31, as filtered by means of a low pass filter 32. The phase detector 31 is connected to receive, at one input thereto, an output from a frequency divider or a reference counter 26, which is connected to receive an output from reference oscillator 23. The reference oscillator 23 is preferably a crystal oscillator, as described previously. The reference counter 26 is operatively coupled to a first frequency division rate setting counter 27 which serves as a transmitter/receiver mode selection circuit to provide a set control signal to the reference counter 26 which serves as a programmable frequency divider for setting the rate of counting by the reference counter 26, whereby the oscillation frequency obtained from the first crystal oscillator 23 is divided adaptably in association with the transmitting and receiving modes to provide a reference signal of the frequency to be a reference to the respective modes. The phase detector 31 is also connected to receive, at the other input thereto, an output from a programmable frequency divider 28, which typically comprises a programmable counter. The programmable frequency divider 28 is connected to receive a pulse output from a mixer 24 for the purpose of counting the number of pulses at the programmed rate and is also connected to receive a control signal from a control CTL for the purpose of controlling the said programmed rate. The prescaler PRE comprises a reference oscillator 25 and a mixer 24 for mixing the oscillation frequency output from the voltage controlled oscillator 20 with the reference frequency output from the reference oscillator 25. The output from the mixer 24 is applied to the above described programmable counter 28 to be frequency divided at a given frequency division rate. The control CTL comprises a channel designating circuit 29 for selectively changing the frequency division rate in association with the channel to be selected by the transceiver, and a second frequency division rate setting counter 30 which serves as a transmitting/receiving mode selection circuit to provide a set control signal to the programmable frequency divider 28 for setting the rate of counting by the counter 28. The transmitting/receiving mode selection circuits 27 and 30 are operatively coupled to the above described transmitter/receiver selection switch 16 in the FIG. 1 transceiver. The control CTL is shown in more detail in FIG. 2A, as to be described subsequently.

The above described phase detector 31 serves to compare the frequency of the reference signal obtained from the reference counter 26 with the frequency of the signal obtained from the programmable counter 28 to provide a signal associated with the difference between the frequencies of the signal being controlled from the programmable counter 28 and the reference signal from the reference counter 26 such that the above described frequency difference associated signal may be positive if and when the frequency of the signal being controlled from the programmable counter 28 is higher than the frequency of the reference signal from the reference counter and vice versa.

Now description will be made of the operation of the frequency synthesizer shown in FIG. 2.

(1) Receiving Mode

In the receiving mode of the transceiver, the frequency synthesizer is utilized as a local oscillator of the transceiver. According to the above described example, the frequency of the output obtained from the output terminal $f_R$ ranges from 26.965 MHz to 27.255 MHz in association with the receiving channels and should be variable at a predetermined frequency difference to provide a given frequency band to the respective receiving channels. As described previously, the output signal from the terminal $f_R$ is obtained by mixing the output from the voltage controlled oscillator 20 with the output from the first crystal oscillator 23, where the oscillation frequency of the output from the first crystal oscillator 23 is fixed to say 10.24 MHz. Accordingly, the control voltage to be applied to the voltage controlled oscillator 20 should be controlled stepwise such that the oscillation frequency of the output from the oscillator 20 is changed stepwise ranging from 27.42 MHz to 27.71 MHz. In the following, description will be made of how such control is effected.

At the outset, the transmitter/receiver selection switch 16 is turned to the receiver side. Accordingly, the transmitting/receiving mode selection circuits 27 and 28 are also turned to the receiving mode. Now consider a case where a transmitted signal of the carrier the frequency of which is 26.965 MHz is to be received among the signals received by the antenna 1 of the transceiver. Accordingly, the channel designating circuit 29 is actuated to designate the desired channel. In order to obtain an intermediate frequency signal of 10.695 MHz based on the signal of 26.965 MHz, the frequency of the signal obtainable from the output terminal $f_R$ must be 37.660 MHz. On the other hand, since the oscillation frequency of the first crystal oscillator 23 is 10.24 MHz, as described previously, the oscillation frequency of the voltage controlled oscillator 20 must be 27.42 MHz. If and when the voltage controlled oscillator 20 is oscillating properly at the frequency of 27.42 MHz, this oscillation signal is mixed by means of the second mixer 24 with the oscillation signal of 25.76 MHz from the second crystal oscillator 25, thereby to provide a signal of the frequency difference of 1.66 MHz. This frequency difference signal is frequency divided by means of the programmable counter 28. The frequency division rate of the programmable counter 28 has been set to 1/166 at that time in response to selection of the receiving mode by the transmitting/receiving mode selection circuit 30 and switching of the channel designating circuit 29 in association with the above described receiving frequency. As a result, the signal being controlled as counted by the programmable counter 28 turns to be 10 KHz. On the other hand, the frequency division rate of the reference counter 26 has also been set to 1/1024 at that time in response to the receiving mode selected by the transmitting/receiving mode selection circuit 27. Accordingly, a reference signal of 10 KHz is also obtained from the reference counter 26. This frequency is not varied, insofar as the receiving mode is selected by the transmitting/receiving mode selection circuit 30. The signal from the programmable counter 28 and the signal from the reference counter 26 are fed to the phase detector 31. However there is no difference between the frequencies of these signals. Therefore, the phase detector 31 does not provide a control signal. As a result, the voltage controlled oscillator 20 continues to oscillate at the frequency of 27.42 MHz.

Assuming that the oscillation frequency of the voltage controlled oscillator 20 varies because of variation of the voltage of the power source, the ambient temperature and the like, the frequency of the signal from the second mixer 24 accordingly varies and thus the frequency of the signal being controlled from the programmable counter 28 also varies, with the result that there occurs a frequency difference between the signals being applied to the phase detector 31. As a result, the phase detector 31 provides a positive or negative control signal in accordance with the frequency difference, thereby to properly correct the oscillation frequency of the voltage controlled oscillator 20. Thus, the oscillation frequency of the voltage controlled oscillator 20 is always corrected to provide an output signal of the desired frequency at the output terminal $f_R$.

Now consider a case where the receiving channel is changed. First the channel designating circuit 29 is switched in association with selection of a new receiving channel, so that the frequency division rate of the programmable counter 28 is accordingly changed. Now let it be assumed that the frequency division rate is changed from the previous value of 1/166 to a new value of 1/195. Since the voltage controlled oscillator 20 is still oscillating at the previous frequency of 27.42 MHz at that time, the frequency of the output from the second mixer 24 is 1.66 MHz. This signal of the frequency of 1.66 MHz is frequency divided by means of the programmable counter 28. Since the frequency division rate of the programmable counter 28 is 1/195, a signal being controlled of the frequency of 8.5 KHz is obtained from the programmable counter 28. Since the frequency of the reference signal obtained from the reference counter 26 is always constant i.e. 10 KHz, there occurs a frequency difference between the signals being applied to the phase detector 31 and accordingly the oscillation frequency of the voltage controlled oscillator 20 increases. The oscillation frequency of the voltage controlled oscillator 20 continues to increase in such a manner, until the frequency of the signal being controlled from the programmable counter 28 reaches 10 KHz. In other words, if and when the oscillation frequency of the voltage controlled oscillator 20 reaches 27.71 MHz, the frequency of the signal from the second mixer 24 becomes 1.95 MHz, which is frequency divided by the programmable counter 28 at the frequency division rate of 1/195 to provide a signal being controlled of 10 KHz, with the result that the oscillation frequency of the voltage controlled oscillator 20 increases to reach the above described frequency of 10 KHz. Since the frequency of the signal obtainable at the output terminal $f_R$ becomes 37.95 MHz at that time, only a transmitted wave signal of the carrier of the frequency 27.255 MHz is selected by the transceiver among the transmitted wave signals received by the antenna.

(2) Transmitting Mode

In the transmitting mode of the transceiver, the inventive frequency synthesizer is utilized to provide a carrier wave for the transmitter portion of the transceiver. Since in the transmitting mode the signal obtained from the output terminal $f_T$ is used by way of a carrier wave signal, the frequency of the output obtained from the output terminal $f_T$ must be stepwise variable within the range of 26.965 MHz to 27.255 MHz in association with a transmitting channel. To that end, the transmitter/receiver selection switch 16 is first turned to the transmitting side. Accordingly, the transmitting/receiving mode selection circuits 27 and 30 are switched to the transmitting mode. The channel designating circuit 29 is also operated to obtain a carrier wave of a desired frequency. Let it be assumed that the frequency division rate of the programmable counter 28 at that time is 1/241, for example. Assuming now that the oscillation frequency of the voltage controlled oscillator 20 is 26.965 MHz, the frequency of the signal from the second mixer 24 turns to be 1.205 MHz and the frequency of the signal from the programmable counter 28 turns accordingly to 5 MHz. On the other hand, since the frequency division rate of the reference counter 26 has been set to the value of 1/2048 at that time in response to the selection of the transmitting mode by the transmitting/receiving mode selection circuit 27. Accordingly the frequency of the reference signal obtainable from the reference counter 26 turns to be 5 KHz and the frequency difference between the signals being applied to the phase detector 31 turns to zero. As a result, the phase detector 31 does not provide a control signal and thus the voltage controlled oscillator 20 oscillates at the previous frequency of 26.965 MHz. The oscillation signal of 26.965 MHz is withdrawn from the output terminal $f_T$ by way of a carrier wave. If and when the oscillation frequency of the voltage controlled oscillator 20 varies, the frequency of the signal from the programmable counter 28 also varies, so that a control signal is obtained from the phase detector, which serves to properly correct the oscillation frequency of the voltage controlled oscillator 20.

If it is desired to change the transmitting channel, the channel designating circuit 29 is switched in such a manner as described previously, whereby the frequency division rate of the programmable counter 28 is changed. Assuming that the oscillation frequency of the voltage controlled oscillator 20 remains as before, the frequency of the signal from the programmable counter 28 differs from the frequency of the signal from the reference counter 26, with the result that the phase detector 31 provides a control signal. Therefore, the oscillation frequency of the voltage controlled oscillator 20 is corrected until the frequency of the signal being controlled from the programmable counter 20 becomes the same as the frequency of the reference signal from the reference counter 26. The oscillation frequency of the voltage controlled oscillator 20, thus corrected is used as a carrier wave signal for the selected transmitted channel.

Figure 2A:
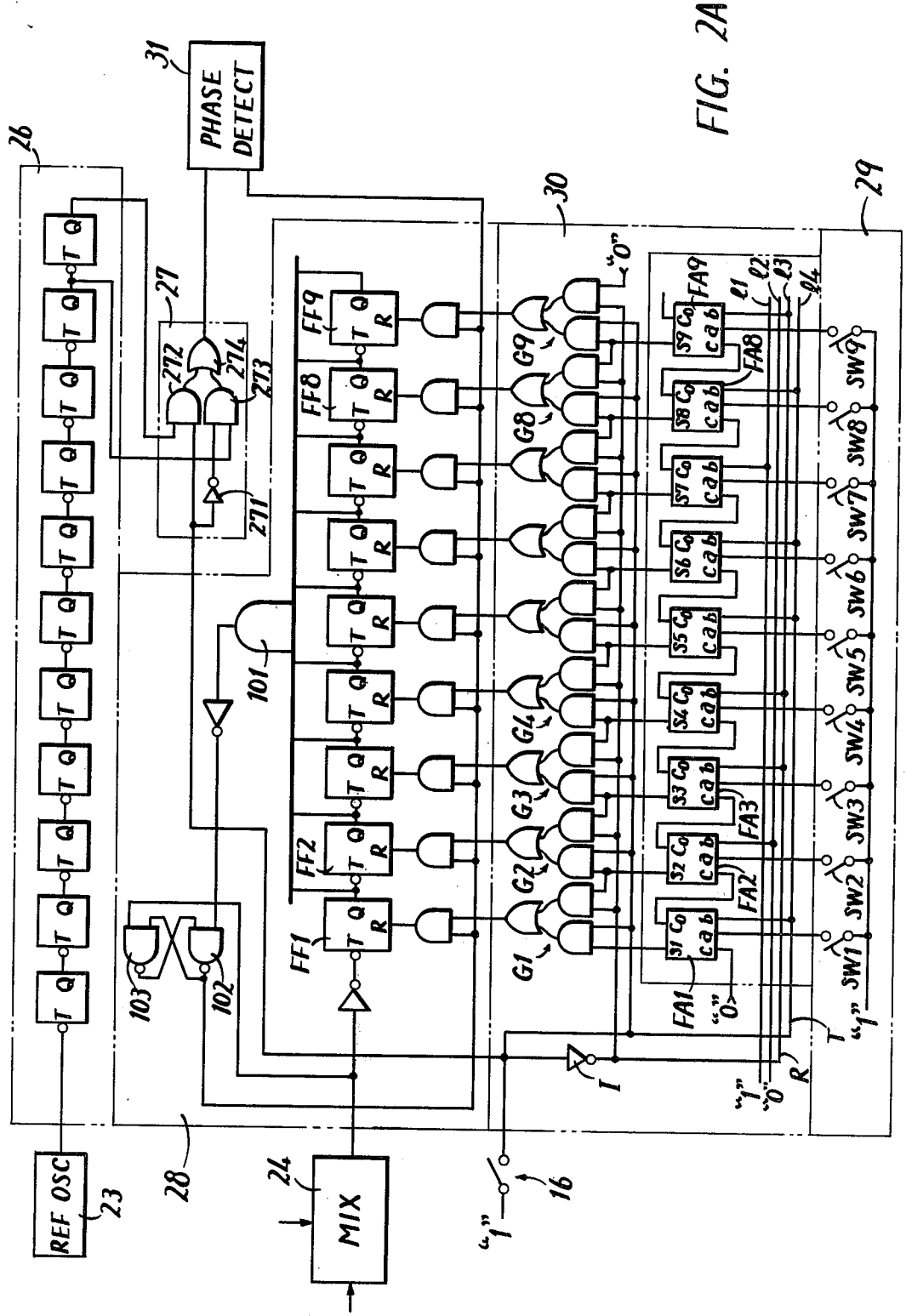
FIG. 2A is a block diagram showing in more detail the transmitting/receiving mode selection circuit 30 and the peripheral portion associated therewith constituting the essential feature of the inventive frequency synthesizer shown in FIG. 2.

FIG. 2A is a block diagram showing in more detail the transmitting/receiving selection circuit 30 and the peripheral portion associated therewith constituting the essential feature of the inventive frequency synthesizer shown in FIG. 2. As described with reference to FIG. 2, the frequency division rate of the programmable counter 28 is controlled by means of the channel designating circuit 29 and the transmitting/receiving mode selection circuit 30. The manner of such control will be described with reference to FIG. 2B, which shows waveforms at various portions in the FIG. 2A diagram.

Referring to FIG. 2A, the channel designating circuit 29 comprises nine switches SW1 through SW9. These switches SW1 through SW9 are connected at one ends thereof commonly to a signal source representing the logic one ("1") and at the other terminals individually to the corresponding inputs of the transmitting/receiving mode selection circuit 30. Assuming that the total number of the channels to be selected is 40, these switches are selectively operated to achieve forty kinds of combinations by means of these nine switches. For example, one channel is selected by selectively turning on the switches SW1 and SW3, another channel is selected by turning on the switches SW2, SW4 and SW8, and so on. The transmitting/receiving mode selecting circuit 30 comprises nine full adders FA1 through FA9 provided in a cascade fashion and nine gate groups G1 through G9, each group comprising two AND gates and one OR gate. Each of these full adders FA1 through FA9 has a carry-in input terminal c, an addend input terminal a, a summand input terminal b, a sum output terminal S, and a carry-out output terminal $C_o$. The truth table of these factors is shown in Table 1.

Table 1

| $a_i$ | $b_i$ | $c_i$ | S | $C_o$ |
|---|---|---|---|---|
| 0 | 0 | 0 | 0 | 0 |
| 0 | 0 | 1 | 1 | 0 |
| 0 | 1 | 1 | 0 | 1 |
| 0 | 1 | 0 | 1 | 0 |
| 1 | 1 | 0 | 0 | 1 |
| 1 | 1 | 1 | 1 | 1 |
| 1 | 0 | 1 | 0 | 1 |
| 1 | 0 | 0 | 1 | 0 |

The carry-out terminal $C_o$ of each of the full adders FA1 through FA9 is connected to the carry-in terminal C of the respective adjacent full adder in the more significant bit position. The carry-in terminal of the full adder FA1 corresponding to the least significant bit position is coupled to the voltage source corresponding to a logic zero ("0"). The addend input terminal a of each of the full adders FA1 through FA9 is connected to the other end of the corresponding one of the switches SW1 through SW9 in the channel designating circuit 29. The summand input terminal b of each of the full adders FA1 through FA9 is connected to any one of four logical signal lines 11 through 14 in the manner to be described subsequently. The logical signal line 11 is adpated to represent the logic 1 state, while the signal line 12 is adapted to represent the logic 0 state. The signal line 13 is connected through an inverter I to the transmitter/receiver selection switch 16 and the signal line 14 is directly connected to the transmitter/receiver selection switch 16, so that in case of the transmitting mode the switch 16 is closed and the signal line 13 is brought to the logic 0 state while the signal line 14 is brought to the logic 1 state whereas in case of the receiving mode the transmitter/receiver selection switch 16 is opened and the logical states of the signal lines 13 and 14 are reversed. In other words, the logical states of the signal lines 13 and 14 are complementary to each other.

Each of the above described gate groups G1 through G9 in the transmitting/receiving mode selection circuit 30 comprises two AND gates and one OR gate, as described previously. One input to one AND gate of these two AND gates is connected to the corresponding one of the sum output terminals S1 through S9 of the full adders FA1 through FA9 and the other input to the said one AND gate of these two AND gates is connected to the logical signal line 14. One input to the other AND gate of these two AND gates is connected to the logical signal line 13 and the other input to the other AND gate of these two AND gates is connected to the sum output S of the adjacent full adder in the next more significant bit position. The outputs from these two AND gates are applied through the corresponding OR gate to the programmable counter 28. The parallel bit output withdrawn from the OR gates are utilized by way of a jam data. These gate groups G1 through G9 are generally referred to as a bit shifter because in case of the receiving mode, i.e. when the signal line 13 is in the logic 1 state, the right side AND gates, as viewed in the figure, of the respective gate groups G1 through G9 are enabled, so that the output from the sum output terminal S of the adjacent full adder in the next more significant bit position is withdrawn from the gate group corresponding to one less significant adjacent bit position, with the result that the bit parallel output from nine full adders FA1 through FA9 are shifted as a whole by one bit.

The above described programmable counter 28 comprises flip-flops FF1 through FF9 each having a reset terminal. The output terminals Q of these flip-flops are connected to the inputs to an AND gate 101 and the output from the AND gate 101 is connected through an inverter to cross connected NAND gates 102 and 103. The input terminal R of each flip-flop is individually connected to the corresponding output of an AND gate group. Each of these AND gates of the group is connected, at one input thereto, to the output of the corresponding one of the gate groups G1 through G9 and, at the other input thereto, commonly to the output of the above described cross connected NAND gates 102 and 103. The terminal T of the flip-flop FF1 corresponding to the least significant bit position is connected to receive an inverted output of the above described mixer 24. The output of the NAND gate 102 is also applied to the phase detector 31 as the output of the programmable counter 28.

The above described reference counter 26 comprises eleven toggle flip-flops (simply referred to as T flip-flops hereinafter) connected in a cascade fashion, structured to provide the frequency division rate of 1/1024 on the occasion of reception and the frequency division rate of 1/2048 on the occasion of transmission. The transmitting/receiving mode selection circuit 27 for selecting the transmitting mode and the receiving mode comprises an inverter 271, two AND gates 272 and 273 and an OR gate 274. Briefly, described, selection of the transmitting mode and the receiving mode is achieved by selectively withdrawing the output of the reference counter 26 comprising T flip-flops from the terminal Q of the right most T flip-flop, as viewed in the figure, or from the terminal Q of T flip-flop next to the right most one. To that end, one input to one AND gate 272 of the above described selection circuit 27 is connected to the terminal Q of the right most T flip-flop and one input to the other AND gate 273 is connected to the terminal Q of the T flip-flop next to the right most one. The other inputs to these AND gates 272 and 273 are connected to receive complementary logical signals, respectively, which may be the output from the transmitter/receiver selection switch 16 and an inverted output thereof. It is readily understood that on the occasion of the transmitting mode, i.e. the frequency division rate 1/2048, the said one AND gate 272 should be enabled and on the occasion of the receiving mode, i.e. the frequency division rate 1/1024, the said other AND gate 273 should be enabled. The outputs from these AND gates 272 and 273 are applied through the OR gate 274 to the phase detector 31.

Now referring to FIG. 2, the operation shown in FIG. 2B and setting of the frequency division rate will be described. Assuming that the frequency division rate of the programmable counter 28 is 1/N, the frequencies at various portions of the FIG. 2 diagram can be evaluated based on the values described previously with reference to FIG. 2.

(1) Output from Second Mixer 24
$(5 \times N)$ KHz ... on the occasion of transmission
$(10 \times N)$ KHz ... on the occasion of reception (2) Output from Voltage Controlled Oscillator 20
$(5 \times N + 25760)$ KHz ... on the occasion of transmission $(10 \times N + 25760)$ KHz ... on the occasion of reception (3) Output from Buffer 21 (Limited to transmission)

$$f_T = (5 \times N + 25760) \text{ KHz}$$

(4) Output from First Mixer 22 (Limited to reception)

$$f_R = [(10 \times N + 25760) + 10240]$$
$$\text{KHz} = (10 \times N + 36000) \text{ KHz}$$

where N is set as follows:

$$N = N_{RO} + \Delta N ... \text{(reception)}$$
$$N = N_{TO} + \Delta N ... \text{(transmission)}$$
$$(\Delta N: 0, 1, 2)$$

Considering a case where such values of $N_{TO}$ and $N_{RO}$ that satisfy $$f_T = 26965 \text{ KHz} ... \text{(transmission)}$$

$$f_R = 37660 \text{ KHz} ... \text{(reception)}$$

When N=0 (as is clear from the subsequent description, the value of $\Delta N$ is dependent on the value set in the channel designating circuit 29 and $\Delta N = 0$ indicates that the value set in the channel designating circuit 29 is zero), the following equations are obtained:

$$5N_{TO} + 25760 = 26965$$
$$N_{TO} = \frac{26965\ 25760}{5} = 241$$
$$10N_{RO} + 36000 = 37660$$
$$N_{RO} = \frac{37660\ 36000}{10} = 166$$

It is appreciated from the foregoing $N_{TO}$ and $N_{RO}$ equations thus obtained that on the occasion of the transmission the frequency $f_T$ is increased by 5 KHz each time the number $\Delta N$ is increased by one and on the occasion of the reception the frequency $f_R$ is varied by 10 KHz each time the number $\Delta N$ is varied by one. Accordingly, in order to vary the frequency $f_T$ by 10 KHz, the number $\Delta N$ should be varied by two.

Connection of the summand input terminal b of each of the full adders FA1 through FA9 in the above described transmitting/receiving mode selection circuit 30 of FIG. 2A and any one of the four signal line 11 through 14 is inherently determined as described in the following by the values of $N_{TO}$ and $N_{RO}$ thus obtained.

$$N_{TO} = 241 = (011110001)_{binary}$$
$$N_{RO} = 166 = (010100110)_{binary}$$
connection of
signal lines (01T1T0RRT)

where T designates the signal line 14 and R designates the signal 13. More specifically, on the occasion of transmission where T=1, the number $N_{TO} = 241 = (011110001)_{binary}$ is applied, in a parallel bit code, to the summand input terminals b of the full adders FA1 through FA9, while on the occasion of reception where R=1 the number $N_{RO} = 166 = (010100110)_{binary}$ is applied, in parallel bit code, to the summand input terminals b of the full adders FA1 through FA9. Assuming that the value set in the channel designating circuit 29 is zero, i.e. all the switches are opened, the said value $N_{TO}$ or $N_{RO}$ may be applied ultimately to the programmable counter 28. However, in the FIG. 2A embodiment, the channel designating circuit 29 has been structured such that the rate of variation of the set value caused by changes of the channel setting remains always constant irrespective of whether the apparatus is in the transmitting mode or in the receiving mode, i.e. the set value changes by two for each channel setting. In other words, the frequencies $f_R$ and $f_T$ are determined by the value set by designation of the channel designating circuit 29, i.e. the logical state P in which $$P = \sum_{i=1}^{9} SW_i 2^{i-1},$$

where $SW_1$ is a binary number in the least significant bit position and $SW_9$ is a binary number of the most significant bit position and $SW_i$ has a logic 1 state if and when the corresponding switch is turned on and has a logic 0 state if and when the corresponding switch is turned off. Thus it is appreciated that these gate groups G1 through G9 are provided to constitute a bit shifter for the purpose of changing the frequencies $f_R$ and $f_T$ by 10 KHz each time the value of the above described logical state combination is changed by 2. The bit shifter is aimed to achieve, during the receiving mode, the following equation:

$$(P+N_{RO'})/2 = N_{RO} + \Delta N$$

the above described equation may be expressed as follows:

$$\frac{P}{2} + \frac{N_{RO'}}{2} = N_{RO} + \Delta N$$

Assuming $N_{RO'}/2 = N_{RO}$, the following equation is obtained, $$P/2 = \Delta N$$

When P is increased by 2, $\Delta N$ increases by one and thus the frequency $f_R$ increases by 10 KHz. Thus, since the bit shifter is utilized, the value $N_{RO'} = 2N_{RO} = 2 \times 166 = 332$ obtained from the above described equation $N_{RO'}/2 = N_{RO}$ is utilized as a data for determining connection of any one of the signal lines 11 through 14 and the summand input terminals b of the full adders FA1 through FA9. Namely, $$N_{TO} = 241 = (011110001)_{binary}$$
$$N_{RO'} = 332 = (101001100)_{binary}$$
connection of
signal lines (RT1TTRR0T) ------------ ①

Referring to the equation ①, the right most end corresponds to the least significant bit position and the left most end corresponds to the most significant bit position. The connection between the four signal lines 11 through 14 and the full adders FA1 through FA9 in FIG. 2A is determined based on such equation.

FIG. 2B shows waveforms of the programmable counter 28 of FIG. 2A for use in explaining the operation thereof. Referring to FIG. 2B, the waveform (1) shows the output from the second mixer 24 and the waveform (2) shows the inverted waveform thereof. The T flip-flops FF1 through FF9 are adapted to be set responsive to the fall of the waveform (2). All the Q outputs from the T flip-flops FF1 through FF9 become "1" if and when the count number by these flip-flops reaches the number "511," and as soon as the count number 511 is reached, a triggering signal shown as the waveform (3) is withdrawn, whereby the frequency divided output of the waveform (4) is obtained from the NAND gate 102. It is to be noted that in the circuit configuration shown the time period corresponding to the count number "511" also corresponds to the count of the numbers corresponding to the reset state by the data from the circuit 30. Assuming, for example, that the parallel bit output value of the T flip-flops FF1 through FF9 when these have been reset is "270," it follows that if and when the above described number 511 is counted the count value becomes 270 simultaneously. In other words, it can be said that the frequency division rate $N = 511 - 270 = 241$.

The transmitting mode/receiving mode selection circuit 27 and the bit shifter 30A in FIG. 2A comprise an improvement aimed to eliminate delay for lock up time of the reference frequency on the occasion of the phase locked loop operation, with the reference frequency at the time of reception being 10 KHz, and if it is desired to make the reference frequency be 5 KHz on the occasion of both transmission and reception, T in the above described circuit 27 and the bit shifter may be fixed to "1."

Figure 2C:
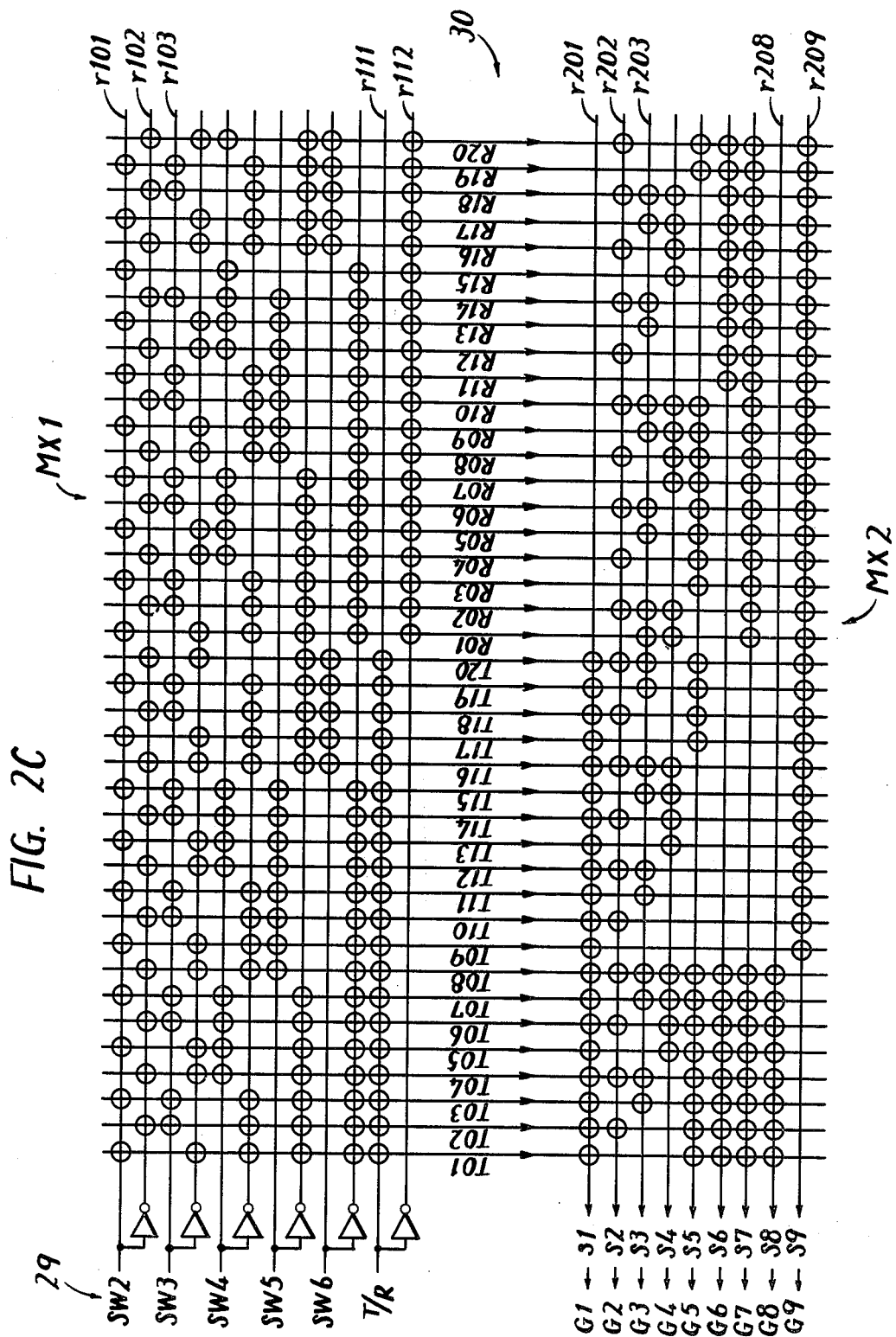
FIG. 2C is a schematic diagram of another embodiment of the transmitting/receiving mode selection circuit in the FIG. 2 embodiment, which can be employed in place of the FIG. 2A embodiment.

FIG. 2C is a schematic diagram of another embodiment of the transmitting/receiving mode selection circuit 30 in FIG. 2, which can be employed in place of the FIG. 2A embodiment. The FIG. 2C embodiment is characterized in that the above described mode selection circuit 30 is implemented by a read only memory (ROM). The read only memory shown comprises a first matrix MX1 comprising row lines r101 through r112 individually connected to the outputs from the switches SW2 through SW6 of the channel designating circuit 29 and the inverted outputs thereof and column lines T01 through T20 and R01 through R20, and a second matrix MX2 comprising the above described column lines T01 through T20 and R01 through R20 withdrawn from the above described first matrix MX1 and column lines r201 through r209. The outputs withdrawn from the row lines r201 through r209 of the above described second matrix MX2 are applied to the gate groups G1 through G9 in FIG. 2A, thereby to represent the rate of frequency division corresponding to a designated channel. The embodiment shown has been structured such that 20 channels can be designated by means of the channel designating circuit 29 on each occasion of transmission or reception. To that end, the column lines T01 through T20 and R01 through R20 are provided in the embodiment shown. The truth table of the parallel bit output of the frequency division rate N obtained at row lines S1 through S9 from the above described second matrix MX2 ultimately is shown in Table 2.

Table 2

| | Decimal N | Binary | | | | | | | | |
|---|---|---|---|---|---|---|---|---|---|---|
| | | $S_9$ | $S_8$ | $S_7$ | $S_6$ | $S_5$ | $S_4$ | $S_3$ | $S_2$ | $S_1$ |
| T01 | 241 | 0 | 1 | 1 | 1 | 1 | 0 | 0 | 0 | 1 |
| T02 | 243 | 0 | 1 | 1 | 1 | 1 | 0 | 0 | 1 | 1 |
| T03 | 245 | 0 | 1 | 1 | 1 | 1 | 0 | 1 | 0 | 1 |
| T04 | 247 | 0 | 1 | 1 | 1 | 1 | 0 | 1 | 1 | 1 |

Table 2-continued

| | Decimal N | Binary | | | | | | | | |
|---|---|---|---|---|---|---|---|---|---|---|
| | | $S_9$ | $S_8$ | $S_7$ | $S_6$ | $S_5$ | $S_4$ | $S_3$ | $S_2$ | $S_1$ |
| T05 | 249 | 0 | 1 | 1 | 1 | 1 | 1 | 0 | 0 | 1 |
| T06 | 251 | 0 | 1 | 1 | 1 | 1 | 1 | 0 | 1 | 1 |
| T07 | 253 | 0 | 1 | 1 | 1 | 1 | 1 | 1 | 0 | 1 |
| T08 | 255 | 0 | 1 | 1 | 1 | 1 | 1 | 1 | 1 | 1 |
| T09 | 257 | 1 | 0 | 0 | 0 | 0 | 0 | 0 | 0 | 1 |
| T10 | 259 | 1 | 0 | 0 | 0 | 0 | 0 | 0 | 1 | 1 |
| T11 | 261 | 1 | 0 | 0 | 0 | 0 | 0 | 1 | 0 | 1 |
| T12 | 263 | 1 | 0 | 0 | 0 | 0 | 0 | 1 | 1 | 1 |
| T13 | 265 | 1 | 0 | 0 | 0 | 0 | 1 | 0 | 0 | 1 |
| T14 | 267 | 1 | 0 | 0 | 0 | 0 | 1 | 0 | 1 | 1 |
| T15 | 269 | 1 | 0 | 0 | 0 | 0 | 1 | 1 | 0 | 1 |
| T16 | 271 | 1 | 0 | 0 | 0 | 0 | 1 | 1 | 1 | 1 |
| T17 | 273 | 1 | 0 | 0 | 0 | 1 | 0 | 0 | 0 | 1 |
| T18 | 275 | 1 | 0 | 0 | 0 | 1 | 0 | 0 | 1 | 1 |
| T19 | 277 | 1 | 0 | 0 | 0 | 1 | 0 | 1 | 0 | 1 |
| T20 | 279 | 1 | 0 | 0 | 0 | 1 | 0 | 1 | 1 | 1 |
| R01 | 332 | 1 | 0 | 1 | 0 | 0 | 1 | 1 | 0 | 0 |
| R02 | 334 | 1 | 0 | 1 | 0 | 0 | 1 | 1 | 1 | 0 |
| R03 | 336 | 1 | 0 | 1 | 0 | 1 | 0 | 0 | 0 | 0 |
| R04 | 338 | 1 | 0 | 1 | 0 | 1 | 0 | 0 | 1 | 0 |
| R05 | 340 | 1 | 0 | 1 | 0 | 1 | 0 | 1 | 0 | 0 |
| R06 | 342 | 1 | 0 | 1 | 0 | 1 | 0 | 1 | 1 | 0 |
| R07 | 344 | 1 | 0 | 1 | 0 | 1 | 1 | 0 | 0 | 0 |
| R08 | 346 | 1 | 0 | 1 | 0 | 1 | 1 | 0 | 1 | 0 |
| R09 | 348 | 1 | 0 | 1 | 0 | 1 | 1 | 1 | 0 | 0 |
| R10 | 350 | 1 | 0 | 1 | 0 | 1 | 1 | 1 | 1 | 0 |
| R11 | 352 | 1 | 0 | 1 | 1 | 0 | 0 | 0 | 0 | 0 |
| R12 | 354 | 1 | 0 | 1 | 1 | 0 | 0 | 0 | 1 | 0 |
| R13 | 356 | 1 | 0 | 1 | 1 | 0 | 0 | 1 | 0 | 0 |
| R14 | 358 | 1 | 0 | 1 | 1 | 0 | 0 | 1 | 1 | 0 |
| R15 | 360 | 1 | 0 | 1 | 1 | 0 | 1 | 0 | 0 | 0 |
| R16 | 362 | 1 | 0 | 1 | 1 | 0 | 1 | 0 | 1 | 0 |
| R17 | 364 | 1 | 0 | 1 | 1 | 0 | 1 | 1 | 0 | 0 |
| R18 | 366 | 1 | 0 | 1 | 1 | 0 | 1 | 1 | 1 | 0 |
| R19 | 368 | 1 | 0 | 1 | 1 | 1 | 0 | 0 | 0 | 0 |
| R20 | 370 | 1 | 0 | 1 | 1 | 1 | 0 | 0 | 1 | 0 |

$$N = \sum_{n=1}^{9} S_n 2^{n-1}$$

In order to obtain such outputs as determined in the truth table shown, the matrixes MX1 and MX2 are structured such that the circle marked intersections therein are selected to have the following meaning. More specifically, the matrixes are structured such that the outputs obtained in the column lines T01 through R20 in the matrix MX1 may be a NANDed output of the inputs as circle marked at the intersections between the said column lines and the row lines r101 through r112, as shown in FIG. 2D, and the final outputs from the read only memory withdrawn through the lines S1 through S9 in the matrix MX2 may be a NANDed output of the inputs as circle marked of the intersections between the said row lines and the column lines T01 through R20, as shown in FIG. 2E.

Now consider a case where the transmitting channel T01 is set, for facility of understanding. In such a situation, the switch SW2 of the channel designating circuit 29 is turned on. Therefore, the column lines r101, r104, r106, r108, r110 and r111 assume a logic 1 state. Accordingly, the column line T01 assumes the logic 0 state and all the remaining column lines T02 through R20 assume the logic 1 state. Therefore, it is appreciated that the logic state combination withdrawn from the lines S1 through S9 is dependent solely on the logic 0 of the column line T01 and becomes (011110001). From the foregoing description, it is further appreciated that in case where a given channel is designated the logic state of only the column line corresponding to the said given channel becomes a logic "0," while all the remaining column lines become the logic "1," with the result that the logic "1" is withdrawn from the circle marked portions of the intersections between the said particular line and the row lines r201 through r209. Thus, it is apparent that the circle mark at the intersections between the column lines T01 through R20 and the row lines r201 through r209 are selected to correspond to the logic "1" in the truth table of Table 2.

Figure 3:
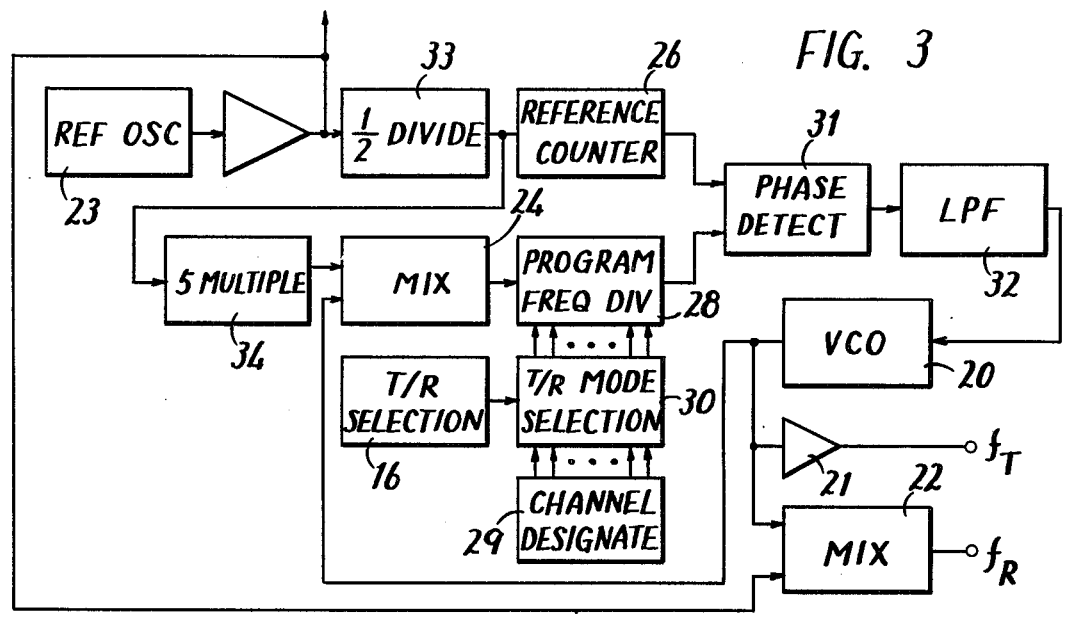
FIG. 3 is a block diagram of another embodiment of the inventive frequency synthesizer.

FIG. 3 is a block diagram of another embodiment of the inventive frequency synthesizer. The point of the FIG. 3 embodiment different from the FIG. 2 embodiment is that the first crystal oscillator 23 is used as the first and second crystal oscillators in terms of the FIG. 2 embodiment and instead a ½ frequency divider 33 and a 5 frequency multiplier 34 are additionally employed. The oscillation signal of the voltage controlled oscillator 20 is directly withdrawn from the output terminal $f_T$ and the oscillation signal thus obtained is utilized by way of a carrier wave signal of the transceiver. Since the second mixer 24 is supplied with the signal of the frequency 25.60 MHz (=10.24×½×5), obtained from the first crystal oscillator 23 through the ½ frequency divider 33 and the 5 frequency multiplier 34 and the oscillation signal of the frequencies 27.42 through 27.71 MHz obtained from the voltage controlled oscillator 20, a signal having frequencies 1.365 MHz through 1.655 MHz is obtained from the second mixer 24. Therefore, if a given channel is set by the channel designating circuit 29 and the frequency division rate of the programmable counter is selected to a value within the range of 273 to 331 in accordance with the set channel, the signal being controlled of approximately 5 KHz is obtained at the output of the programmable counter 28. On the other hand, the reference counter 26 always provides the reference signal of a fixed frequency of 5 KHz. Accordingly, as in case of the FIG. 2 embodiment, the phase detector 32 serves to compare the frequencies of the above described signal being controlled and the reference signal, thereby to provide a positive or negative control signal, if and when there is a frequency difference therebetween, to control the frequency of the voltage controlled oscillator 20 to the correct value.

Figure 3A:
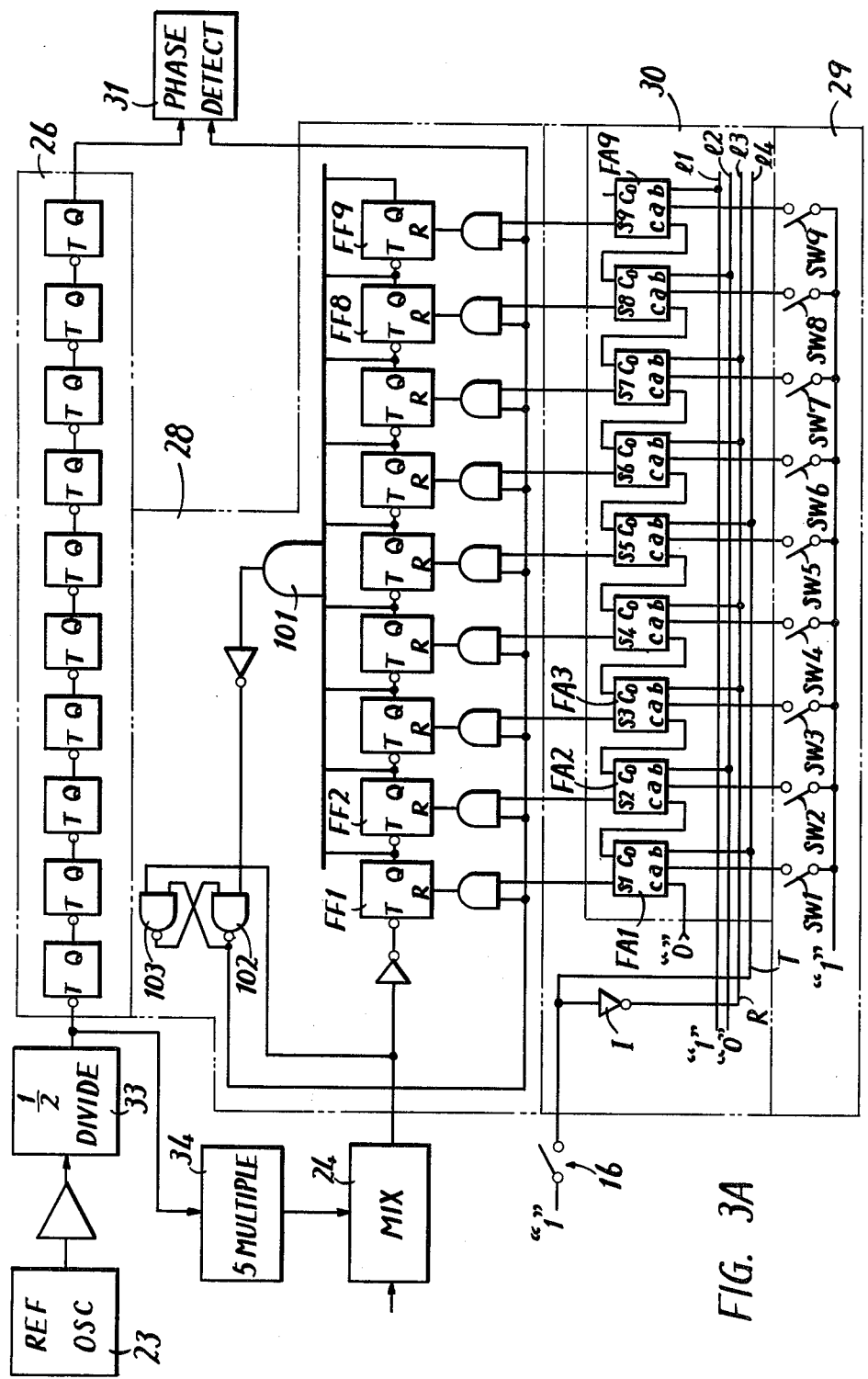
FIG. 3A is a schematic diagram of the transmitting/receiving mode selection circuit 30 in the FIG. 3 embodiment.

FIG. 3A is a schematic diagram of the transmitting-/receiving mode selection circuit 30 in FIG. 3 and portions associated therewith. The relation of the FIG. 3A to FIG. 3 is similar to the relation of FIG. 2A to FIG. 2. Since the FIG. 3 embodiment has been structured such that the reference frequency of the reference counter 26 may be the same value of 5 KHz both in the transmitting mode and in the receiving mode, the bit shifter included in the transmitting/receiving mode selection circuit 30 shown in FIG. 2A has not been employed in the FIG. 3A embodiment. Similarly, the frequency division rate of the reference counter 26 remains constant to be 1/1024, only ten T flip-flops are employed. Connection of any one of the logic signal lines 11 through 14 and the summand input terminals b of the full adders FA1 through FA9 is determined in a manner the same as that described with reference to FIG. 2A.

Figure 4:
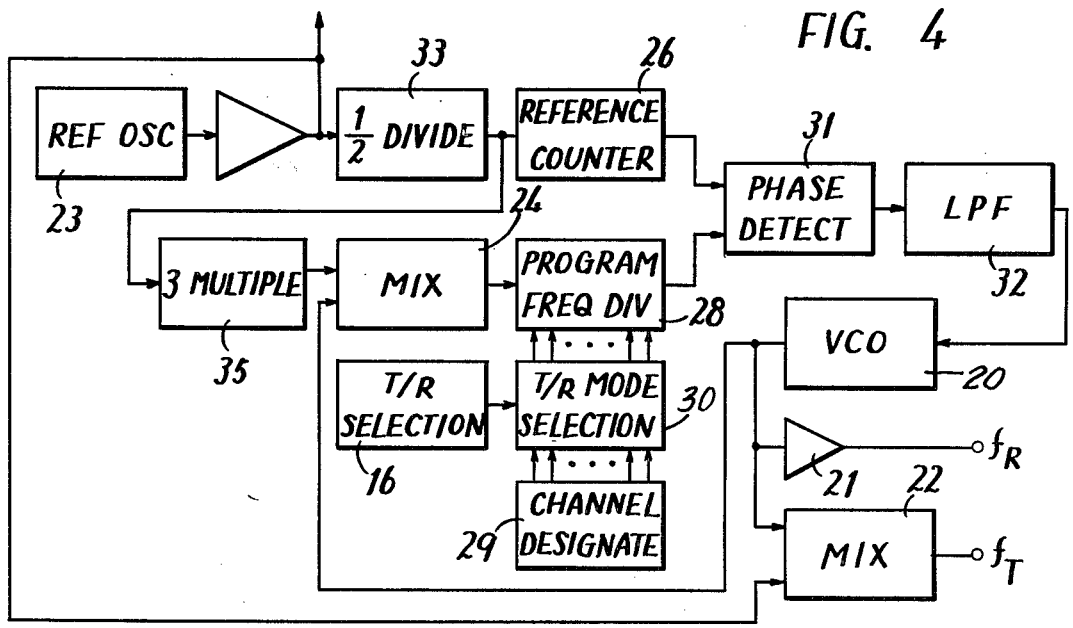
FIG. 4 is a block diagram of a further embodiment of the inventive frequency synthesizer.

FIG. 4 is a block diagram of a further embodiment of the inventive frequency synthesizer. The FIG. 4 embodiment is substantially the same as the FIG. 3 embodiment in the block diagram structure, but employs a three-frequency multiplier 35 in place of the five-frequency multiplier 34 in the FIG. 3 embodiment. The FIG. 4 embodiment is further different from the FIG. 3 embodiment in that the signal obtainable from the output terminal $f_T$ for withdrawing the carrier wave signal of the transceiver is obtained by mixing the oscillation signal of the first crystal oscillator 23 with the oscillation signal of the voltage controlled oscillator 20. The signal obtainable from the output terminal $f_R$ for withdrawing the local oscillation signal for supply to the mixer 4 of the transceiver is directly withdrawn from the voltage controlled oscillator 20. A further difference therebetween is that the FIG. 3 embodiment utilizes, by way of the local oscillation signal, a signal 10.695 MHz higher than the signal obtained from the antenna 1, whereas the FIG. 4 embodiment uses, by way of the local oscillation signal, a signal of 16.27 through 16.56 MHz which is 10.695 MHz lower than the signal of the frequencies 26.965 MHz through 27.255 MHz received by the antenna.

Figure 4A:
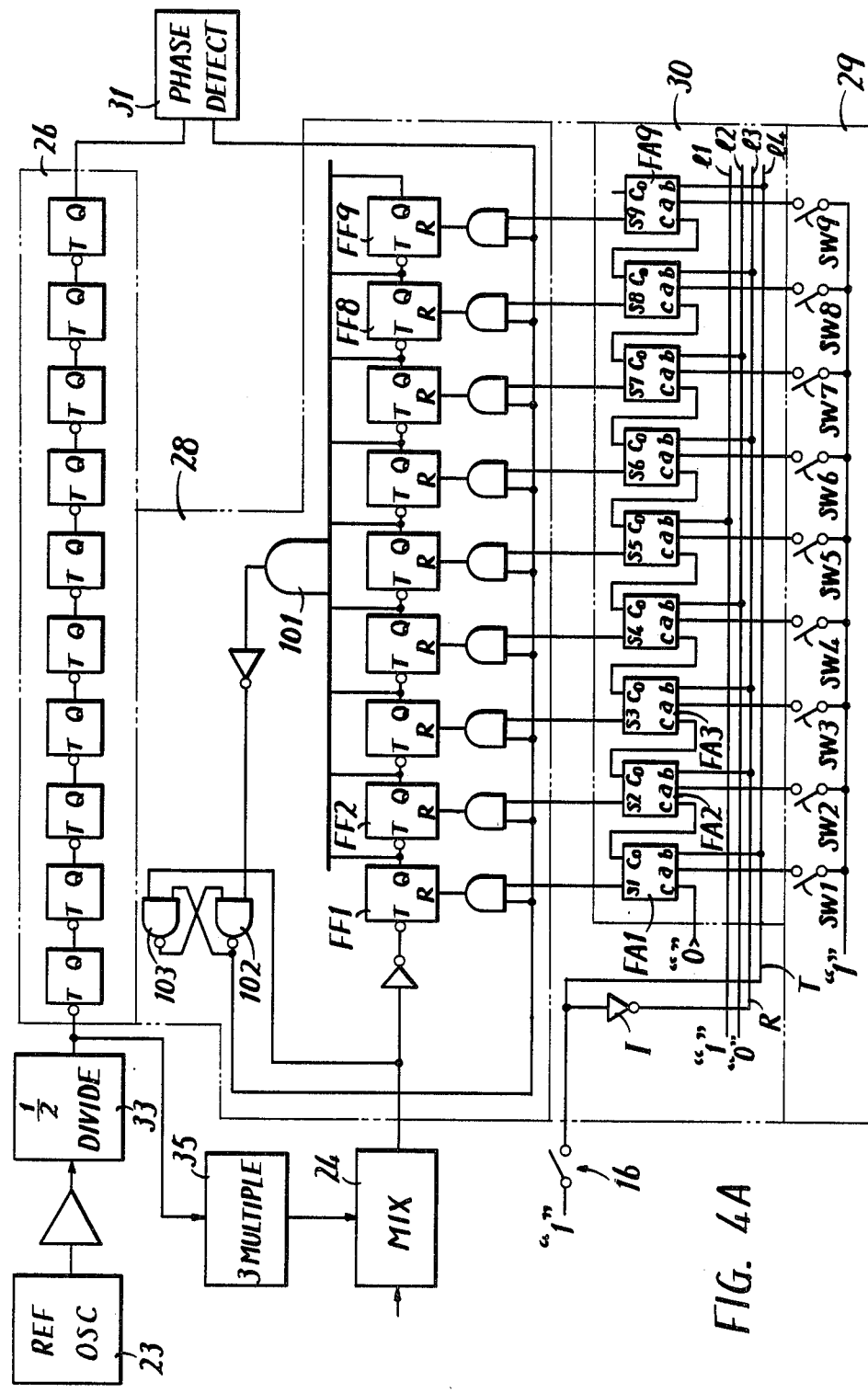
FIG. 4A is a schematic diagram showing in more detail the transmitting/receiving mode selection circuit 30 in the FIG. 4 embodiment.

FIG. 4A is a schematic diagram showing in more detail the transmitting/receiving mode selection circuit 30 and the portions associated therewith shown in FIG. 4. The structure of the FIG. 4A embodiment is substantially the same as that of the FIG. 3A embodiment, the difference therebetween being that the frequency division rate of the programmable counter 28 is different, as shown in FIG. 4, and accordingly connection of any one of the logic signal lines 11 through 14 and the summand input terminals b of the full adders FA1 through FA9 determinable based thereon is accordingly different.

In the foregoing, the embodiments were described by taking an example of the channels for transceivers of the type which normally are to be borne in automobiles. Therefore, the embodiments were structured such that the frequency division rate of the reference counter is different in the receiving and transmitting modes so that the reference signal of different frequencies is used for the purpose of controlling. However, in a different transmitting/receiving system, a reference signal of the same frequency may be used in the transmitting and receiving modes. In the latter situation, a frequency synthesizer can be implemented that employs a minimum number of voltage controlled oscillators and crystal oscillators, by making the frequency division rate of the programmable counter different in the transmitting and receiving modes in the manner as described above.

As described in the foregoing, the inventive frequency synthesizer is structured such that a signal being controlled having a frequency similar to that of a reference signal from a voltage controlled oscillator is obtained by means of a programmable counter. Therefore, the signals of many oscillation frequencies can be obtained with a lesser number of crystal oscillators. The inventive frequency synthesizer has been further structured such that the frequency division rate of the above described programmable counter is variable in accordance with the channels and also in accordance with the terminals to be used by the transmitting/receiving mode selection circuit. Therefore, even in case where the output frequency signal of different frequency variable range is obtained from two or more output terminals, a voltage controlled oscillator can be commonly used, with the result that the circuit configuration of the inventive apparatus is very simple.

In general, a programmable counter to be used by way of a frequency dividing means most often comprises field effect transistors, of such as the MOS type. Assuming that the output frequency of the above described voltage controlled oscillator becomes abnormally high, such as in case where the oscillator is diverted from a balanced state in channel switching, for example, such MOS type field effect transistors come to exceed the operating limit to cause a malfunction of the programmable counter, whereby an output of the frequency is obtained which is lower than that normally obtained by the frequency division. If and when the frequency of such an abnormal output signal becomes lower than that of the frequency divided output of the oscillation signal from the crystal oscillator, the control signal obtained from the phase detector serves to further enhance the oscillation frequency of the voltage controlled oscillator, so that the feed back operation in the system is lost. As a result, the output signal of the frequency fixed to a possible upper limit frequency is obtained from the voltage controlled oscillator. Accordingly, it is also desired that any problems whatsoever for causing the above described malfunction is solved.

FIG. 5 is a block diagram of still a further embodiment of the inventive frequency synthesizer aimed to solve the above described problem, wherein consideration has been given to prevent any malfunction of a programmable counter for frequency dividing the oscillation signal of the voltage controlled oscillator. The structure of the FIG. 5 embodiment is based on the FIG. 2 embodiment and therefore the same or like portions have been denoted by the same reference characters. By way of a characteristic feature of the FIG. 5 embodiment, the embodiment shown comprises an operation limit detector 500 coupled to the reference counter 26 and the programmable counter 28 for preventing the above described malfunction, and a gate circuit 600 connected between the above described programmable counter 28 and the phase detector 31. The gate circuit 600 comprises a set of first and second AND gates 610 and 620, an inverter 630 connected between these AND gates 610 and 620, and an OR gate 640. One input terminal of the respective first and second AND gates 610 and 620 is connected directly and through the inverter 630 to the above described operation limit detector 500. The other input terminal of the first AND gate 610 is connected to the output of the signal being controlled of the programmable counter 28 and the other input terminal of the second AND gate 620 is connected to the stage preceding the final stage of the reference counter 26. In other words, the gate circuit 600 serves to prevent the signal being controlled from the programmable counter 28 from being applied to the phase detector 31 and instead allows the output of the stage preceding the final stage of the reference counter 26 to be applied to the phase detector 31, if and when the operation limit detected output is obtained from the operation limit detector 500.

Referring to FIG. 5A, which shows in more detail a schematic diagram of the operation limit detector 500 and associated blocks, the detector 500 comprises one-shot multivibrators 510 and 520 connected to the reference counter 26 and the programmable counter 28, respectively, a pair of MOS type transistors 540 and 530 on/off controlled responsive to the outputs from these multivibrators 510 and 520, a capacitor 550 connected to be charged or discharged responsive to on/off control of these transistors 530 and 540, and a Schmitt circuit 560 for providing a pulse output if and when the charged voltage in the capacitor 550 reaches a predetermined value. The frequency of the signal supplied from the programmable counter 28 to the one-shot multivibrator 520 on the occasion of a normal operation is selected to be larger than the frequency of the signal supplied from the reference counter 26 to the one-shot multivibrator 510. Accordingly, on the occasion of the normal operation, the quantity of voltage discharged from the capacitor 550 while the MOS type transistor 530 is turned on is larger than the quantity of voltage charged on the capacitor 550 while the MOS type transistor 540 is turned on. Therefore, the charged voltage of the capacitor 550 does not reach a value high enough to turn on the Schmitt circuit 560. Now assuming that the programmable counter 28 causes a malfunction whereby the frequency of the output signal extremely decreases to be lower than the frequency of the signal from the reference counter 26, then the quantity of voltage charged on the capacitor 550 while the MOS type transistor 540 is turned on is larger than the quantity of voltage discharged from the capacitor 550 while the MOS type transistor 530 is turned on. As a result, the charged voltage in the capacitor 550 becomes a level higher than the threshold voltage where the Schmitt circuit 560 is operable, whereby an output signal is obtained from the Schmitt circuit 560. In other words, this operating point is the detection point of the limit detector 500. The above described operation has been best seen in FIG. 5B, wherein the waveform (a) shows a time period when the MOS transistor 540 is turned on, the waveform (b) shows the time period when the MOS type transistor 530 is turned on, and the waveform (c) shows the charging and discharging state of the capacitor 550. In FIG. 5B, the waveform (b) has been drawn at a larger interval at the right half portion to show a decrease of the frequency and the point d shown in the waveform (c) denotes the above described detection point.

Now the operation of the FIG. 5 embodiment will be described with reference to FIG. 5A. The fundamental operation of the frequency synthesizer shown in FIG. 5 is substantially the same as that described previously centering on the FIGS. 2 and 2A embodiment. Therefore, only a characteristic feature of the FIG. 5 embodiment will be described. As described previously with reference to FIG. 2, if and when the oscillation frequency of the voltage controlled oscillator 20 is varied as a function of variation of the source voltage or an ambient temperature, the frequency of the output from the second mixer 24 is varied accordingly and thus the frequency of the output from the programmable counter 28 is also varied, with the result that a frequency difference is caused between the input signals to the phase detector 31 and a control signal associated with the frequency difference is obtained from the phase detector 31, which served to correct the oscillation frequency of the voltage controlled oscillator 20. If and when variation of the frequency of the voltage controlled oscillator 20 is small, such variation is sufficiently corrected by such embodiment. However, assuming that the frequency of the voltage controlled oscillator 20 varies abnormally to a higher value because of a noise in channel switching, for example, it could happen that MOS type transistors constituting the programmable counter 28 exceeds a frequency limit to cause a miss count by means of the programmable counter 28 or to fully stop the count. This could cause an extreme decrease of the frequency of the signal supplied from the programmable counter 28 to the operation limit detector 500, with the result that the charged voltage in the capacitor 550 in the operation limit detector 500 becomes higher enough to provide a signal from the Schmitt circuit 560 (see the waveform (c) in FIG. 5B). If and when the detection point d of the operation limit detector 500 is reached, as shown in FIG. 5B, the signal obtainable from the Schmitt circuit 560 is applied to the second AND gate 620 in the gate circuit 600, so that the second AND gate 620 is turned on while the first AND gate 610 is turned off. As a result, the signal of the higher frequency obtained from the stage preceding the final stage of the reference counter 26 is applied through the gate circuit 600 to the phase detector 31. Therefore, the frequency difference between the input signals to the phase detector 31 becomes larger, whereby the increase in the frequency of the input signal to the programmable counter 28 is emphasized, whereby a larger positive control signal is obtained form the phase detector 31. Since the control signal reduces the oscillation frequency of the voltage controlled oscillator 20 to the lower limit of the stabilized operation region thereof, it does not follow that the oscillation frequency of the voltage controlled oscillator 20 exceeds the operation limit of the programmable counter to lose the feed back function of the system.

In the foregoing, the description was made of a case where an operation limit detector is employed which is operative when the frequency of the programmable counter exceeds the allowable upper limit value. Alternatively, however, a different frequency synthesizer can also be obtained that is characterized in that the detection point resides in the frequency slightly lower than the allowable maximum limit value of the programmable counter, an operation limit detector responsive to the detection point for providing an output signal is employed, and if and when the frequency of the input signal to the programmable counter reaches the above described detection point the signal from the programmable counter to the phase detector is forcibly switched to the signal of the frequency higher than that of the reference signal, in response to the output signal from the operation limit detector, as in case where the above described limit value is exceeded, whereby operation of the apparatus is always achieved within the stabilized operation region.

In case where the allowable operable frequency of the programmable counter has the maximum value such as in case where the programmable counter is implemented by an MOS dynamic logic, an operation limit detector may be employed that provides an output signal when a frequency slightly higher than the allowable lower limit value is reached and the signal from the programmable counter to the phase detector may be forcibly switched to the frequency lower than that of the reference signal in response to the output from the detector, whereby the frequency of the voltage controlled oscillator can be enhanced to a stabilization region of the programmable counter and hence a malfunction of the apparatus can be prevented.

Although this invention has been described and illustrated in detail, it is to be clearly understood that the same is by way of illustration and example only and is not to be taken by way of limitation, the spirit and scope of this invention being limited only by the terms of appended claims.

What is claimed is:

1. A frequency synthesizer for providing a signal of a frequency lying within at least one of respective first and second frequency ranges, said frequency synthesizer comprising:
    voltage controlled oscillator means for producing a signal whose frequency is variable as a function of a control voltage,
    first counter means for changing the frequency of the signal produced by said voltage controlled oscillator means,
    first means for controlling the amount of frequency change to be produced by said first counter means,
    means for producing a reference frequency signal of a fixed frequency,
    second means responsive to the output of said first counter means and said reference frequency signal for producing a control voltage for said voltage controlled oscillator means whereby said frequency synthesizer produces a signal whose frequency is related to the amount of frequency change caused by said first counter means as controlled by said first means,
    means for selecting first and second operating modes including means for operating said first means which thereby controls said first counter means to produce respective first and second frequency changes of the signal produced by the voltage controlled oscillator means such that said voltage controlled oscillator means produces a signal within the corresponding said first and second frequency ranges according to the respective first and second operating mode selected, second counter means for receiving the fixed frequency reference frequency signal and for changing the same to first and second predetermined frequencies for application to said second means in response to the operation of said operating mode selecting means selecting a respective one of said first and second operating modes, and
    first output means for receiving the signals from said voltage controlled oscillator means and said reference signal producing means to produce an output signal having a frequency in said first range and second output means for producing a signal at the frequency of the output signal of said voltage controlled oscillator means in accordance with the selection of a respective one of said first and second operating modes.

2. A frequency synthesizer as in claim 1 wherein the second predetermined frequency of said second counter means is one half of said first predetermined frequency.

3. A frequency synthesizer for providing a signal of a frequency lying within at least one of respective first and second frequency ranges, said frequency synthesizer comprising:
    voltage controlled oscillator means for producing a signal whose frequency is variable as a function of a control voltage,
    means for changing the frequency of the signal produced by said voltage controlled oscillator means,
    first means for controlling the amount of frequency change to be produced by said frequency changing means,
    means for producing a reference frequency signal at a fixed frequency,
    means responsive to the output of said frequency changing means and said reference frequency signal for producing a control voltage for said voltage controlled oscillator means whereby said frequency synthesizer produces a signal whose frequency is related to the amount of frequency change caused by said frequency changing means as controlled by said first means,
    means for selecting first and second operating modes including means for operating said first means to control said frequency changing means to produce a different frequency change ratio as between said first and second operating modes such that said voltage controlled oscillator means produces a signal within the corresponding said first and second frequency ranges according to the operating mode selected,
    second means for receiving said reference frequency signal and for changing the frequency of said fixed frequency reference signal which is applied to said control voltage producing means by a predetermined amount, including means for dividing the frequency of said reference frequency signal prior to application to said control voltage signal producing means, means for multiplying the frequency of said divided reference frequency signal, means for mixing the multiplied frequency of the reference frequency signal and the output from said voltage controlled oscillator means and applying the signal produced by the mixing to said frequency changing means, and
    first and second output means for producing respective first and second output signals in said first and second frequency bands in response to the selection of a respective one of said first and second operating modes by said mode selecting means.

4. A frequency synthesizer in accordance with claim 3 in which said frequency changing means comprises means for dividing the frequency of the output from said voltage controlled oscillator means, and said first means comprises means for controlling the amount of frequency division by said frequency changing means.

5. A frequency synthesizer in accordance with claim 3 in which said mode selecting means comprises:

means for selectively designating said first frequency range or second frequency range; and further comprising means for operating said first means to control said frequency changing for selectively designating a desired frequency within said first and second frequency ranges.

6. A frequency synthesizer as in claim 3 wherein the multiplying means multiplies the divided frequency by n times, where n is an odd integer.

7. A frequency synthesizer as in claim 6 wherein the means for dividing the frequency of the reference frequency signal divides said signal by one half.

8. A frequency synthesizer for providing a signal of a frequency lying within at least one of respective first and second frequency ranges, said frequency synthesizer comprising:

voltage controlled oscillator means for producing a signal whose frequency is variable as a function of a control voltage, means for modifying the frequency of the signal produced by said voltage controlled oscillator means, first means for controlling the amount of frequency modification to be produced by said frequency modifying means, means for producing a reference frequency signal at a fixed frequency, means responsive to the output of said frequency modifying means and said reference frequency signal for producing a control voltage for said voltage controlled oscillator means whereby said frequency synthesizer produces a signal whose frequency is related to the amount of frequency modification caused by said frequency modifying means as controlled by said first means, means for selecting first and second operating modes including means for operating said first means which thereby controls said frequency modifying means such that said voltage controlled oscillator means produces a signal within the corresponding said first and second frequency ranges according to the operating mode selected, first and second output means for producing respective first and second output signals in said first and second frequency bands in response to the selection of a respective one of said first and second operating modes by said mode selecting means, means for dividing the frequency of said reference frequency signal prior to application to said control voltage signal producing means, means for multiplying the frequency of said reference frequency signal, and means for mixing the multiplied frequency of the reference frequency signal and the output from said voltage controlled oscillator means and applying the signal produced by the mixing to said frequency modifying means.

9. A frequency synthesizer for providing a signal of a frequency lying within at least one of respective first and second frequency ranges, said frequency synthesizer comprising:

voltage controlled oscillator means for producing a signal whose frequency is variable as a function of a control voltage, means for dividing the frequency of the signal produced by said voltage controlled oscillator means, first means for controlling the amount of frequency division to be produced by said frequency dividing means, means for producing a reference frequency signal at a fixed frequency, means responsive to the output of said frequency dividing means and said reference frequency signal for producing a control voltage for said voltage controlled oscillator means whereby said frequency synthesizer produces a signal whose frequency is related to the amount of frequency division caused by said frequency dividing means as controlled by said first means, means for selecting first and second operating modes including means for operating said first means which thereby controls said frequency dividing means to produce different amounts of frequency division as between said first and second operating modes such that said voltage controlled oscillator means produces a signal within the corresponding said first and second frequency ranges according to the operating mode selected, second means responsive to the output of said mode selecting means for dividing the frequency of said reference signal which is applied to said control voltage producing means, and said operating mode selecting means including, means for selectively designating said first frequency range or second frequency range, and means for selectively designating a desired frequency within said first and second frequency ranges, said means of said mode selecting means for operating said first means including means for storing information concerning the amount of frequency division in bit parallel coded form having a plurality of bit positions, said frequency range designating means comprising means for assuming a first state for providing a first logical signal or a second state for providing a second logical signal, said frequency designating means comprising means for setting said bit parallel information having a plurality of bit positions, said storing means comprising a plurality of full adder means constituting said plurality of bit positions of said bit parallel information, each said full adder means having a carry-over output connected to a carry-in input of the adjacent full adder in the more significant bit position and a first addition input coupled to the corresponding bit output from said channel designating means and a second addition input coupled in advance fixedly to any one of said first logical signal, second logical signal, first state output and second state output from said frequency range designating means, whereby information concerning the amount of frequency division corresponding to the output from said frequency range designating means and the output from said frequency designating means is set, means responsive to the output from said frequency range designating means and the output from said frequency designating means for withdrawing information concerning the amount of frequency division corresponding to a designated frequency within a selected frequency range from said storing means for applying the same to said frequency dividing means, and first and second output means for producing respective first and second output signals in said first and second frequency bands in response to the selection of a respective one of said first and second operating modes by said mode selecting means.

* * * * *